United States Patent [19]
Kirschner

[11] 4,063,224
[45] Dec. 13, 1977

[54] CIRCUIT FOR THE PRODUCTION OF READ-OUT PULSES

[75] Inventor: Nikolaus Kirschner, Johannesburg-Berea, South Africa

[73] Assignee: Siemens Aktiengesellschaft, Berlin & Munich, Germany

[21] Appl. No.: 670,409

[22] Filed: Mar. 25, 1976

[30] Foreign Application Priority Data

Apr. 3, 1975 Germany .............................. 2514582

[51] Int. Cl.$^2$ .............................................. G11C 11/40
[52] U.S. Cl. ...................................... 365/189; 365/184
[58] Field of Search ............................... 307/238, 279; 340/173 R, 173 UT

[56] References Cited
U.S. PATENT DOCUMENTS 4,004,285  1/1977  Bormann et al. ................. 340/173 R

*Primary Examiner*—Vincent P. Canney
*Attorney, Agent, or Firm*—Hill, Gross, Simpson, Van Santen, Steadman, Chiara & Simpson

[57] ABSTRACT

A circuit for producing read-out pulses for storage matrices having $MI_1I_2S$ transistors includes a $MI_1I_2S$ transistor which is subjected to the same writing processes in the same way as the $MI_1I_2S$ transistors of the storage matrix, and a read-out voltage is established by this $MI_1I_2S$ transistor.

7 Claims, 4 Drawing Figures

CIRCUIT FOR THE PRODUCTION OF READ-OUT PULSES

BACKGROUND OF THE INVENTION

1. Field of the Invention

This invention relates to a circuit for the production of read-out pulses for a $MI_1I_2S$ storage matrix which is constructed with $MI_1I_2S$ transistors.

2. Description of the Prior Art $MI_1I_2S$ transistors have a double layer gate. Here, the threshold voltage is dependent upon the charge stage of the boundary between the two insulating layers $I_1$ and $I_2$. Traps located at this boundary can become charged and discharged by positive and negative gate voltages. Consequently, the $MI_1I_2S$ storage transistors possess either a high threshold voltage or a low threshold voltage which can be employed for the storage of digital information. Read-out is effected by connecting a gate voltage having an amplitude which lies between the two values of the threshold voltages.

In the case of repetitive write-in of information, however, the disadvantage arises that the threshold voltages of the transistors become shifted. If, however, the amplitude of the read-out pulses remains constant, it is possible to differentiate between the threshold voltages up to the shift with which the transistor possessing the one threshold voltage is conductive whereas the transistor possessing the other is nonconductive. If, however, this condition is not fulfilled, it is no longer possible to read out the information from the transistor as when the read-out voltage is connected the transistor is either always conductive or always nonconductive.

SUMMARY OF THE INVENTION

The primary object of the present invention, therefore, resides in the provision of a circuit for the production of read-out pulses for $MI_1I_2S$ storage matrices, with the aid of which the number of writing processes is to be as great as possible, without a shift in the threshold voltages of the storage transistors of the matrix affecting the differentiation between the items of information which are to be read out.

The above object is realized by a circuit for the production of read-out pulses for storage matrices having $MI_1I_2S$ transistors, which circuit is particularly characterized in that the same contains a $MI_1I_2S$ transistor which is subjected to the writing processes in the same manner as the $MI_1I_2S$ transistors of the storage matrix, the read-out voltage being established by this $MI_1I_2S$ transistor.

The essential advantage of a circuit constructed in accordance with the invention resides in the fact that the read-out voltage is set up by a $MI_1I_2S$ transistor--preferably by a MNOS transistor or a MAOS transistor--which is subjected to the writing processes in the same manner as the storage transistors of the matrix.

Advantageously, these read-out transistors, which determine the read-out voltage, can be integrated in each row of a matrix.

Advantageously, a voltage minimally higher than the lower threshold voltage is connected to the gate during the read-out process. This yields a satisfactory operation, as the shifts of the lower threshold voltages are equal for all $MI_1I_2S$ transistors in the storage matrix and in the circuit for producing read-out pulses. Consequently, the shift of the low threshold voltage, which is promoted by the connected read-out voltage, is less than in the case of a constant read-out voltage, as it is necessary to select a constant read-out voltage to be higher. Therefore, it is possible to read out the storage transistors more frequently.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
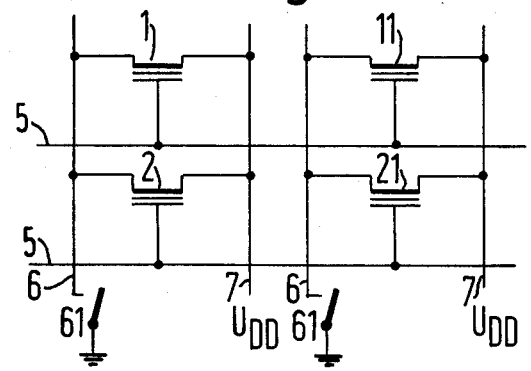
FIG. 1 is a schematic circuit diagram of a $MI_1I_2S$ storage matrix.

Referring to FIG. 1, a known storage matrix constructed of $MI_1I_2S$ transistors, preferably with MNOS transistors, is illustrated. Here, the MNOS transistors of the storage matrix possess a double layer gate insulator which, for example, consists of a layer of $SiO_2$ which is approximately 2 nm thick and an overlying $Si_3N_4$ layer which is approximately 45 nm thick. At the boundary between the $SiO_2$ layer and the $Si_3N_4$ layer are located a large number of traps which can be charged or discharged by different voltages. Consequently, the transistor either possesses a high threshold voltage or a low threshold voltage. Here "threshold voltage" is to be understood as the voltage across the gate of the transistor with which the transistor becomes conductive. These two states can be used for storing the information "0" and "1".

The mode of operation of the MNOS storage matrix will be explained making reference to the storage matrix illustrated in FIG. 1 which has two times two transistors. The matrix consists of the transistors 1, 11, 2 and 21. Here the transistors 1 and 11 are arranged in one row and the transistors 2 and 21 are arranged in another row; the transistors 1 and 2 are arranged in one column and the transistors 11 and 21 are arranged in another column. Prior to the beginning of operation, a "0" is first written into all of the transistors, i.e. the entire memory is erased. For this purpose--assuming the use of p-channel MNOS transistors--the gate lines 5 are connected to 0V, and the source line 6 and the drain lines 7 are connected to approximately -40V.

Subsequently, write-in is effected row-by-row into the matrix, for which purpose the "0" prevailing in specific transistors in a row is transcribed into a "1". If, for example, a "1" is to be written into the transistor 11, the potential of -40V for example is connected to the gate line of the row in which the transistor 11 is located. The drain line of the column in which the transistor 11 is located is connected to the supply voltage $U_{DD}$ which preferably amounts to approximately -20V. The source line of the associated column which contains the transistor 11 is connected by way of the switch 61 to a reference potential, preferably ground. In order to prevent a "1" being written into the transistor 1 in the same row, the corresponding switch 61 is left open in the source line of the column in which the transistor 1 is located. Thus, the inversion layer of the transistor 1 carries the potential of the supply voltage $U_{DD}$. The gate voltage carried by the line 5 of the transistor 1 is not sufficient to bring the transistor 1 into the "1" state. It remains in the "0" state. The switch 61 in the source line of the transistor 11, on the other hand, is closed. The entire gate voltage lies between the gate and the substrate. The transistor 11 is switched into the "1" state. Thus, a "1" is selectively written into the transistor 11, whereas all of the other transistors remain in their "0" state.

Reading is effected in that the corresponding source line 6 is connected to ground potential, the corresponding drain line 7 is connected via a load transistor to the supply voltage $U_{DD}$, and the read-out voltage is connected to the corresponding gate line 5. The magnitude of the read-out voltage is here to lie between the threshold voltage values produced by the positive and negative writing pulses. In this case, the storage transistor is traversed by a current when it possesses a low start voltage, whereas the storage transistor remains blocked in the case of a high start voltage.

The following considerations led to the present invention. If the storage transistors are subjected to repetitious writing, degradation effects occur which cause a shift of the threshold voltages. If, however, the read-out voltage remains constant, reading can only take place while the read-out voltage lies between the threshold voltages. The storage matrix is no longer capable of functioning when the read-out voltage reaches either the gate voltage required for switching on or the threshold voltage of the transistor which is to remain nonconductive. This limit can, in accordance with the present invention, be extended by altering the read-out amplitude in accordance with the low threshold voltage. This can be achieved in that the read-out voltage is set up with the aid of a $MI_1I_2S$ transistor, preferably by means of a MNOS transistor, which is subjected to the same writing processes as the storage transistors of the storage matrix.

Figure 2:
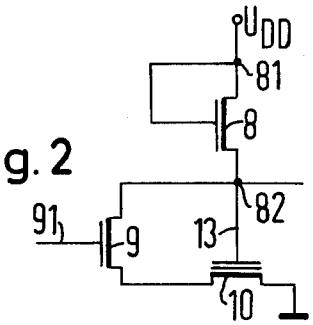
FIG. 2 is a schematic circuit diagram of a circuit, constructed in accordance with the invention, which serves to produce read-out pulses for the storage matrix illustrated in FIG. 1.
Figure 3:
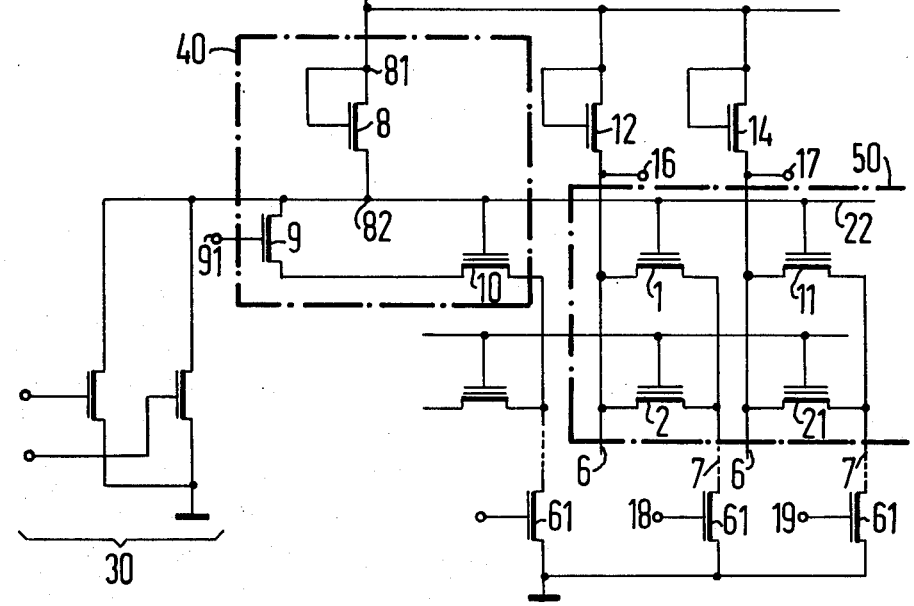
FIG. 3 is a schematic circuit diagram of a $MI_1I_2S$ storage matrix having address decoders and the circuit constructed in accordance with the present invention which serves to produce read-out pulses.

FIG. 2 illustrates a circuit constructed in accordance with the invention for producing read-out pulses with the aid of a $MI_1I_2S$ transistor. This circuit comprises an input transistor 9, a load transistor 8 and the $MI_1I_2S$ transistor 10. The three transistors are connected to one another in the manner illustrated in FIG. 2. The gate of the transistor 9 forms the input, referenced 91, of the circuit. The output of the circuit is referenced 82. If either no voltage or else only a voltage which is smaller than the threshold voltage of the input transistor 9 is connected to the input 91, then only the load transistor 8 is switched on and, consequently, the supply voltage reduced by the threshold voltage of the transistor 8, or thereabout, $U_{DD} - U_{TS}$ is connected to the output 82. If, on the other hand, a voltage which is higher than the threshold voltage of the transistor 9 is connected to the input 91, all three transistors 8, 9 and 10 are switched on and the output 82 is connected by way of the $MI_1I_2S$ transistor and via the transistor 9 with a low voltage. This low output voltage is equal to the sum of the threshold voltage of the transistor 10 and the effective gate voltage of the transistor 10, the latter being determined by the current flowing in the stage. In accordance with the invention, the transistor 10 is a $MI_1I_2S$ transistor and is operated in such a manner that it possesses the low threshold voltage of the storage transistors of the matrix. In this way it is ensured that the output voltage exceeds the lower voltage level of the storage matrix. The last-mentioned voltage component determines how much greater the read-out voltage is than the low threshold voltage of the storage transistors. By suitable dimensioning of the stage, i.e. by the selection of the geometry of the transistors, it is possible to set this voltage to arbitrary values within a wide range. The effective gate voltage can then be established for the storage transistors having a low threshold voltage. It is also advantageous to take into consideration the technical spread of these threshold voltages. Advantageously, the $MI_1I_2S$ transistor of a circuit constructed in accordance with the present invention for producing the read-out pulses can be integrated into the storage matrix, as illustrated in FIG. 3. Details of FIG. 3 which have already been described in association with FIGS. 1 and 2 have corresponding reference characters. The circuit constructed in accordance with the invention for producing read-out pulses is referenced 40. The $MI_1I_2S$ storage matrix is referenced 50. For each row of the matrix 50, a circuit for providing read-out pulses is provided, as taught by the present invention. In FIG. 3 the circuit 40 is illustrated as connected to the row 22 having the storage transistors 1 and 11. Further circuits 40 which serve to produce read-out pulses for other rows of the matrix 50 have not been illustrated on the drawing in the interest of simplicity and clarity. With each writing process of the row, the MNOS transistor 10 of the circuit 40 which produces the read-out voltage pulses is likewise written so that this transistor is degraded in the same manner as the storage transistors of that particular row in the matrix 50. Here, a statistical distribution of the writing process is most favorable. It can be seen from the circuit illustrated in FIG. 3 that the MNOS transistor 10 of the circuit constructed in accordance with the invention can be written into in precisely the same manner as the storage transistors of the matrix. Only the transistor 9 is disconnected during the writing process and is connected again following the process. Each row of the matrix 50 is connected to a decoder 30, which is per se well known in the art. In order that the read-out voltage may be connected to the row 22 of the matrix 50, the transistor 9 is switched conductive by way of the gate terminal 91.

Figure 4:
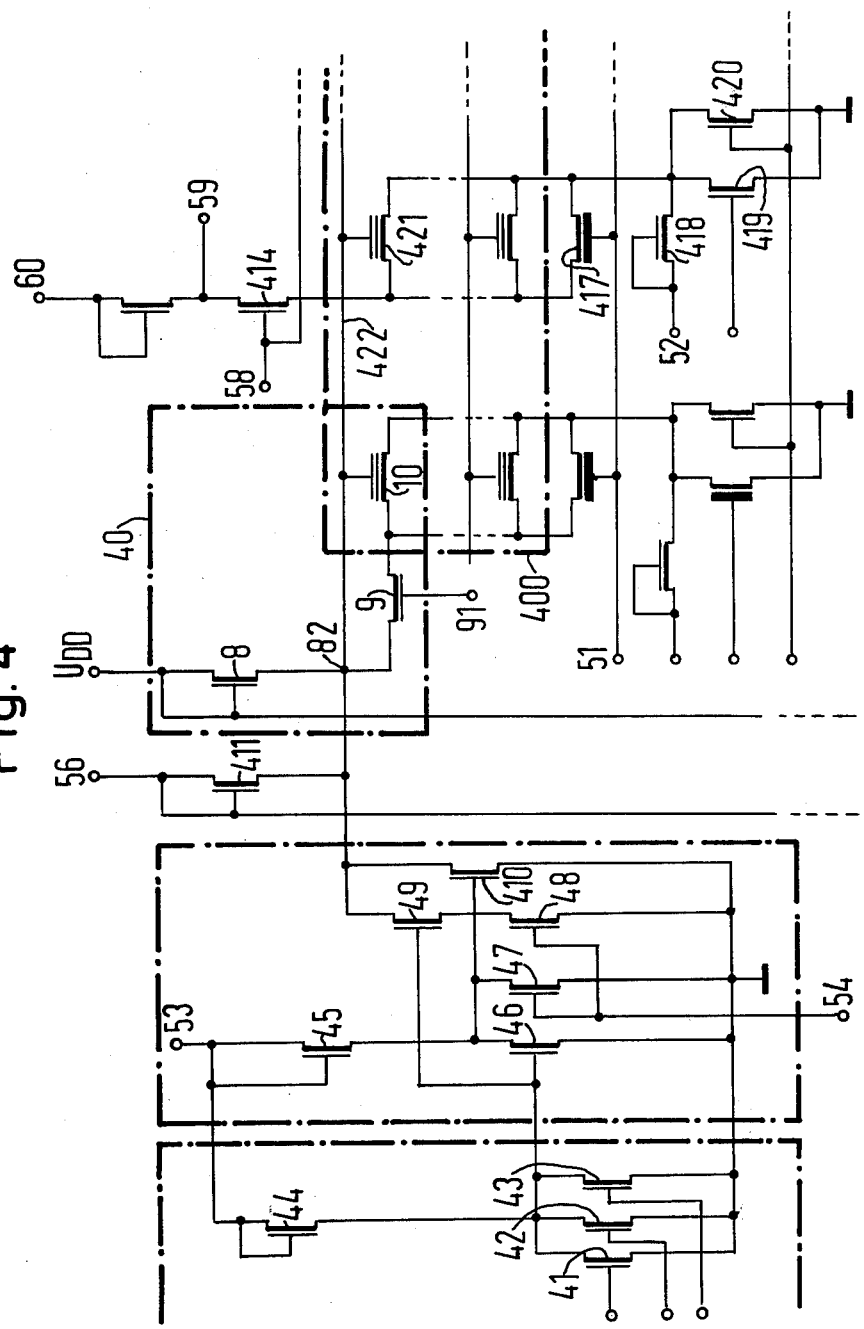
FIG. 4 is a schematic circuit diagram of a storage matrix having $MI_1I_2S$ transistors of short channel length and having the circuit constructed in accordance with the invention for producing read-out pulses.

FIG. 4 represents a storage circuit constructed in the single channel technique having a storage matrix which possesses storage transistors of short channel length. This circuit and the operation thereof is described in detail in the German Pat. No. 2,245,688 which corresponds to British application 38,194 and to U.S. Pat. applications Ser. No. 398,397 and 576,989 of Karl-Ulrich Stein and Karl Heinrich Horninger entitled "MNOS Transistor, the U.S. applications being filed Sept. 18, 1973 and May 13, 1975 respectively, the latter having issued as U.S. Pat. No. 4,021,787. The circuit 40 which is constructed in accordance with the present invention to produce read-out voltages is designed under the same principle as the corresponding circuit in FIG. 3. In FIG. 4, details which have already been described in association with FIGS. 1 to 3 are referenced correspondingly. Details relating to the storage matrix, the decoder gates and the EXCLUSIVE-OR gates which are described in FIG. 4 of the abovementioned German Pat. No. 2,245,688 are also correspondingly referenced.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. For use with a storage matrix of $MI_1I_2S$ storage transistors each having a gate and connected in rows with the gates connected to gate lines, a circuit for producing read-out pulses comprising:

a further $MI_1I_2S$ transistor including a source-drain path, and a gate connected to a gate line as the gates of the $MI_1I_2S$ transistors of the matrix; and control means connected to said source-drain path and to said gate for operating said further $MI_1I_2S$ transistor in the same manner as said $MI_1I_2S$ storage transistors, said control means connecting said source-drain path in a voltage divider circuit which is operable to produce read-out voltage pulses on the gate line.

2. The circuit of claim 1, wherein said control means comprises a load connected to a first supply potential; and a first transistor having a source, a drain and a gate, said gate constituting the input of said circuit for receiving input control pulses, the source-drain path of said first transistor connected in series with the source-drain path of said further $MI_1I_2S$ transistor to a second supply potential and in series with said load to the first supply potential, the connection of said load and said first transistor constituting an output for said circuit, said gates of said further $MI_1I_2S$ transistor and said storage transistors connected to said output, said first transistor operable in response to the level of the input signal to produce a read-out voltage signal.

3. The circuit of claim 2, wherein said load comprises a field effect transistor having a gate connected to the first supply potential.

4. The circuit of claim 1, wherein said further $MI_1I_2S$ transistor is a MNOS transistor.

5. The circuit of claim 1, wherein said further $MI_1I_2S$ transistor is a MAOS transistor.

6. The circuit of claim 1, wherein the storage transistors are $MI_1I_2S$ short channel length transistors, said further $MI_1I_2S$ transistor having a short channel length.

7. For use with a storage matrix of $MI_1I_2S$ storge transistors arranged in rows with each having a gate connected to a gate line, a circuit for producing read-out voltages, comprising:

an input for receiving input signals;

an output for connection to the gate line;

a load transistor connected to a first potential and to said output;

an input transistor including a gate connected to said input, and a source-drain path; and a $MI_1I_2S$ transistor including a gate connected to said output and a source-drain path connecting said source-drain path of said input transistor to a second potential, said circuit operable in response to an input signal which is less than the threshold voltage of said input transistor to provide an output signal which is equal to the first potential minus the threshold potential of said load transistor, and operable in response to an input signal of approximately the first potential to provide an output signal which is equal to the sum of the lower threshold voltage of said $MI_1I_2S$ transistor and the effective gate voltage of said $MI_1I_2S$ transistor.

* * * * *